United States Patent [19]

Schrenk

[11] Patent Number: 5,001,332

[45] Date of Patent: Mar. 19, 1991

[54] METHOD AND CIRCUIT FOR MANIPULATION-PROOF DEVALUATION OF EEPROMS

[75] Inventor: Hartmut Schrenk, Haar, Fed. Rep. of Germany

[73] Assignee: Siemens Aktiengesellschaft, Munich, Fed. Rep. of Germany

[21] Appl. No.: 286,520

[22] Filed: Dec. 19, 1988

[30] Foreign Application Priority Data

Dec. 17, 1987 [DE] Fed. Rep. of Germany ....... 3742894

[51] Int. Cl.$^5$ .............................................. G06K 19/06
[52] U.S. Cl. .................................... 235/492; 235/436; 235/441
[58] Field of Search ........................ 235/436, 441, 492

[56] References Cited

U.S. PATENT DOCUMENTS

| | | |
|---|---|---|
| 4,572,946 | 2/1986 | Schrenk .......................... 235/492 X |
| 4,648,076 | 3/1987 | Schrenk . |
| 4,680,736 | 7/1987 | Schrenk . |
| 4,853,526 | 8/1989 | Effing ................................. 235/492 |

FOREIGN PATENT DOCUMENTS

| | | |
|---|---|---|
| 0123177 | 10/1984 | European Pat. Off. . |
| 0129054 | 12/1984 | European Pat. Off. . |
| 2463457 | 2/1981 | France . |
| 56-71885 | 6/1981 | Japan . |
| 2061820 | 5/1981 | United Kingdom . |

OTHER PUBLICATIONS

Handbuch der Modernen Datenverarbeitung; Forkel-Verlag; Book 136, Jul. 1987; "Einsatzmöglichkeiten der Chipkarte" (Merten Danneck).

*Primary Examiner*—David Trafton
*Attorney, Agent, or Firm*—Herbert L. Lerner; Laurence A. Greenberg

[57] ABSTRACT

A debit card includes at least one address and control logic circuit and a nonvolatile memory having a zone with memory locations provided for storing updated devaluation status of the debit card. At least part of the memory is electrically erasable and all of the memory locations of the zone of the nonvolatile memory can be read out and written upon bit by bit. A method and circuit for devaluation of a monolithically integrable electronic circuit of the debit card includes dividing the zone of the nonvolatile memory into partial zones each having a different value in the form of a multi-stage counter. A simultaneous erasure of the memory cells is permitted only for all of the memory cells of one partial zone of a given value. Erasure of each partial zone is permitted only after a transfer bit has been written into a previously unwritten memory cell of the partial zone of next-higher value. Writing-in is monitored with a logic circuit. An erasure of the partial zone of the highest value is permitted only under special conditions.

7 Claims, 1 Drawing Sheet

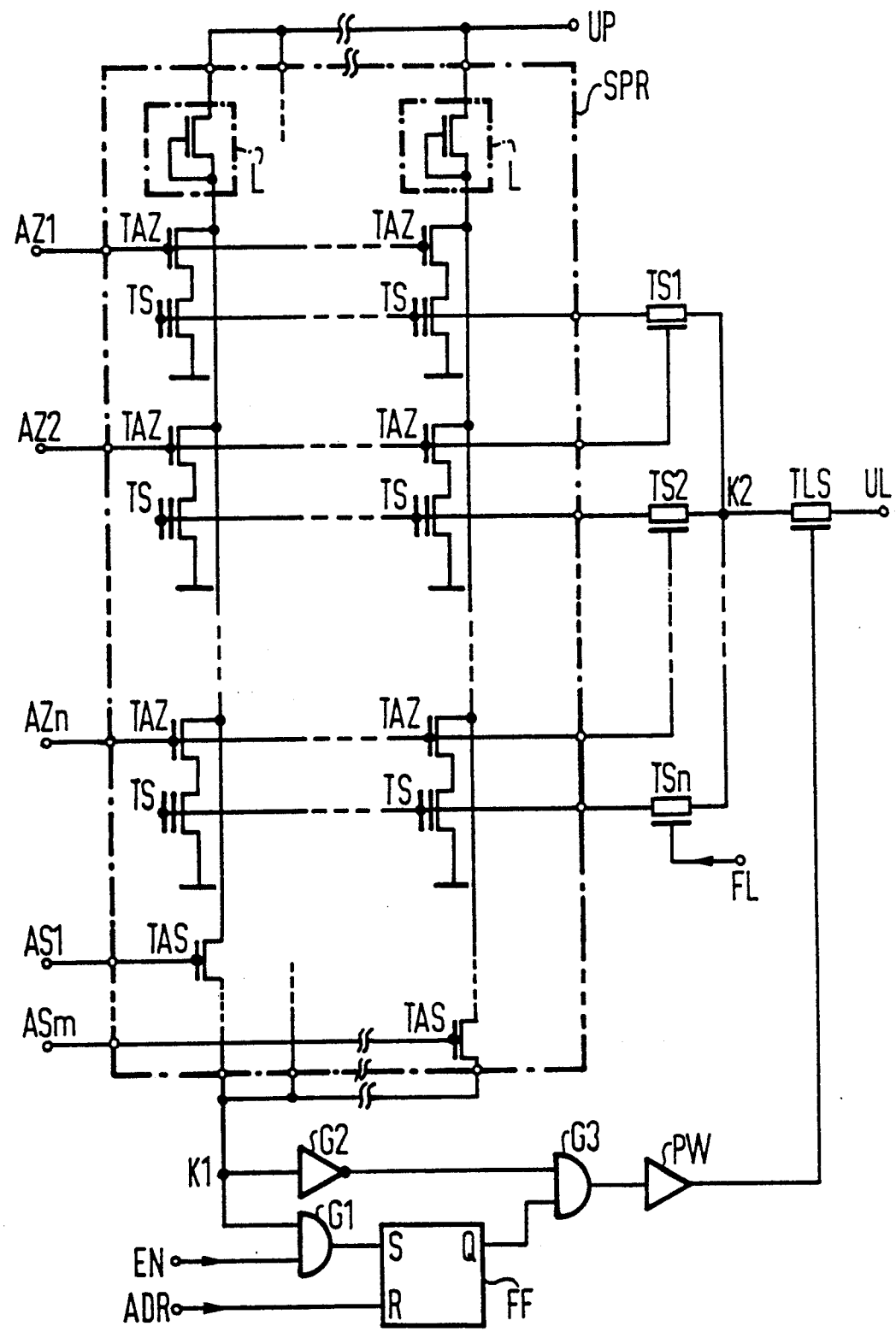

METHOD AND CIRCUIT FOR MANIPULATION-PROOF DEVALUATION OF EEPROMS

The invention relates to a method for devaluation of the monolithically integrable electronic circuit of a debit card, which includes at least one address and control logic circuit and a nonvolatile memory, in which at least part of the memory is electrically erasable and all of the memory locations of a zone of the nonvolatile memory provided for storing the updated devaluation status can be read out and written upon bit by bit The invention also relates to a circuit for performing the method including an electrically erasable memory with a matrix of two-transistor memory cells having a selection transistor and a memory transistor, which are individually selectable through line selection lines and column selection lines, wherein the control gate terminals of the memory cells are connected line by line to a common control line, the drain terminals of the memory cell selection transistors are connected columnwise to column lines, and the column lines are each connected through a load element to the programming potential and through switching transistors, which can be triggered through the column selection lines connected to the gate terminals thereof, to a common first circuit node.

Data-controlled payment systems for cash-free payment for goods or services and the like are known in the form of data exchange systems, such as those described in the article entitled "Einsatzmöglichkeiten der Chipkarte" [Possibilities for Use of the Chip Card] by Danneck in the "Handbuch der Modernen Datenvermittlung" [Modern Data Switching Handbook] No. 136, Jul. 1987. The chip cards used therein contain a nonvolatile (read-only) electric data memory as an essential element, to which access can be made through electric contacts on the surface of the card. Through a data input/output device, access to the memory contents is made each time the card is used by a computational unit; the memory contents are then changed as applicable.

Especially when used in debit cards, or in other words pre-paid data carrier configurations that enable anonymous payment for goods or fees for services, assurance must be provided that even if the "value" of the cards might be reduced by manipulation, it cannot be increased by such means.

A memory based on non-electrically erasable EPROM technology has heretofore been used to protect against alteration or erasure of the memory contained in such cards, as is also described in the aforementioned article, "Possibilities for Use of the Chip Card". Circuits protected in this manner, such as Thompson Semiconductors TS1001 chips, require a separate memory cell for each pre-payable and creditable unit, so that the number of maximum available units when used in standardized chip cards is greatly limited by the available chip surface area.

The article entitled "16K EEPROM Relies on Tunneling for Byte-Erasable Program Storage" by Johnson, Kuhn, Renninger and Perelegos, Electronics, Feb. 28, 1980, describes an electrically erasable memory in which the memory cell field is formed of memory cells disposed in matrix form. The cells have memory transistors of the floating gate type with gate connections (control gate of the memory cell) connected together line by line to a control line, as well as selection transistors with gate connections (selection gate of the memory cell) connected together line by line to a selection line. The individual selection lines are triggerable by the corresponding outputs of a line decoder That memory is erasable completely or line by line, in which case the line to be erased must be selected through the selection line. Published European Application No. 0 123 177, in particular FIG. 2 thereof, discloses an embodiment of a memory matrix of that type in which the selection transistors of the individual memory cells belonging to one line each have the drain terminal thereof connected to a column line and the source terminal thereof connected to the drain terminal of the associated memory transistor of the floating gate type. The source terminal of the memory transistor is connected to a reference potential, and the individual column lines are each connected through a load element to the programming potential and can be connected through a respective column selection transistor to a circuit node that furnishes the data contents of the selected memory cell. The gate terminals of the various column selection transistors are triggered by the corresponding outputs of the column decoder The control lines of the various memory cell lines are each connected through a respective load element to the programming potential, in particular the erase potential, and can be connected to the reference potential, both through a transistor controllable by a write signal and through a transistor controllable by an expensive logic circuit, as a function of the control line potential, in order to prevent erasure.

In circuits of the type disclosed in European Application No 0 123 177, an erasure procedure can only be carried out line by line, after a check bit has been written into a non-erasable check memory. The number of line erasure processes is limited by the number of available non-erasable check memory cells, so that the ratio between the number of existing memory cells and the number of the unequivocally detectable events is only slightly better than in EPROMS. Through the use of the circuit described in European Application No. 0 123 177, a controlled erasure of the nonvolatile memory or ROM is attainable at relatively major expense for circuitry and requires additional signals. As a result, the chip surface area that is saved because of the multiple use of the memory cells as compared to EPROM circuits of the same unit number, is partly unavailable anyway because it is occupied by an expensive logic circuit and the check or control memory.

It is accordingly an object of the invention to provide a method and circuit for the unequivocal manipulation-proof devaluation of EEPROMS and recordation of a great number of events using a EEPROM, which overcomes the hereinafore-mentioned disadvantages of the heretofore-known methods and devices of this general type and to do so with a low number of memory cells and a simple control circuit.

With the foregoing and other objects in view there is provided, in accordance with the invention, a method for devaluation of a monolithically integrable electronic circuit of a debit card, including at least one address and control logic circuit and a nonvolatile memory having a zone with memory locations provided for storing updated devaluation status of the debit card, at least part of the memory being electrically erasable and all of the memory locations of the zone of the nonvolatile memory can be read out and written upon bit by bit, which comprises dividing the zone of the nonvolatile memory into partial zones each having a different value in the form of a multi-stage counter, permitting a simultaneous erasure of the memory cells only for all of the memory cells of one partial zone of a given value, and permitting erasure of each partial zone only after a transfer bit has been written into a previously unwritten memory cell of the partial zone of next-higher value, monitoring writing-in with a logic circuit, and permitting an erasure of the partial zone of the highest value only under special conditions.

In accordance with another mode of the invention, there is provided a method which comprises irreversibly suppressing an erasure of the partial zone of highest value.

In accordance with a further mode of the invention, there is provided a method which comprises irreversibly suppressing an erasure of the partial zone of highest value by destruction of a fusible cutout.

With the objects of the invention in view, there is also provided a monolithically integrable circuit for devaluation of a monolithically integrable electronic circuit of a debit card having at least one address and control logic circuit and a nonvolatile memory having a zone with memory locations provided for storing updated devaluation status of the debit card, at least part of the memory being electrically erasable and all of the memory locations of the zone of the nonvolatile memory can be read out and written upon bit by bit, the circuit comprising an electrically erasable memory with a matrix of two-transistor memory cells each including a selection transistor, a memory transistor and a control line, line selection lines and column selection lines for individually selecting the memory cells, common control lines connected linewise to the gate terminals of the memory cells, the drain terminals of the selection transistors being connected columnwise to the column selection lines, load elements each connecting a respective one of the column selection lines to a programming potential, a common first circuit node, switching transistors each being connected through a respective one of the column selection lines to the first circuit node, the gate terminals of the switching transistors being connected to and triggered by the column selection lines, a common second circuit node, other switching transistors each connecting a respective control line of the memory cells to the second circuit node, the gate terminal of each of the other switching transistors being connected to the line selection line of the zone of next-higher value, a specially secured line triggering the gate terminal of the other switching transistor of the zone of the highest value, an erasure switching transistor connecting the second circuit node to an erasing potential, and a logic circuit controlling the switching state of the erasure switching transistor.

In accordance with an added feature of the invention, the specially secured line includes a fusible cutout.

In accordance with an additional feature of the invention, the specially secured line is activatable only with the use of a security code.

In accordance with a concomitant feature of the invention, there are provided first and second AND gates each having two inputs and an output, an inverting circuit having an input connected to the first circuit node and an output connected to one of the inputs of the second AND gate, the first circuit node also being connected to one of the inputs of the first AND gate, the other of the inputs of the first AND gate being subjected to an evaluation signal, and a flip-flop having a setting input connected to the output of the first AND gate, a reset input acted upon by a reset signal from the address logic circuit upon each address change, and an output connected to the other of the inputs of the second AND gate, and the output of the second AND gate being connected to the control input of the erasure switching transistor.

Other features which are considered as characteristic for the invention are set forth in the appended claims.

Although the invention is illustrated and described herein as embodied in a method and circuit for manipulation-proof devaluation of EEPROMS, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

The drawing is a schematic circuit diagram of a circuit for an unequivocal, manipulation-proof devaluation of the monolithically integrable electronic circuit of a debit card.

Referring now to the single FIGURE of the drawings in detail, there is seen a circuit for the manipulation-proof devaluation of a monolithically integrable electronic circuit of a debit card, which includes at least one address and control logic circuit and a nonvolatile memory or ROM, in which at least some of the memory is electrically erasable and all of the memory locations of the zone of the ROM provided for storing the updated devaluation status can be read out and written upon bit by bit. In order to facilitate the method according to the invention, the aforementioned zone of the memory intended for storage of the devaluation state of the debit card is divided into partial zones (bytes) each having a different value and is used as a multi-stage counter. Based on circuitry provisions, an erasure of the memory cells is simultaneously possible only for all of the memory cells of one partial zone of particular value, and each partial zone can be erased only after a transfer bit has been written into a previously unwritten memory cell of the partial zone of the next-higher value. This writing-in is monitored by a logic circuit. An erasure of the partial zone of the highest value is possible only under special conditions. In particular, the erasure of the partial zone of highest value is suppressed for the future, prior to the activation of the circuit configuration, by the destruction of a fusible cutout.

One or more memory cell lines each form one partial zone, to which its own value is assigned The memory cells of the partial zone of lowest value are written upon in succession for devaluation. Once all of the memory cells of this partial zone have been written upon, a previously unwritten memory cell in the vicinity of the next higher value is written upon, this process checked, and then all of the memory cells of the zone of lower value are erased. Subsequently, all of the memory cells of the zone of lowest value are once again written upon in succession, and the method is continued in all of the partial zones, until all of the memory cells have been written upon.

A possible counting sequence will be described below, taking as an example a memory having three partial zones of different values and three bits per partial zone of a certain value, which is shown in part. In this case, a zero represents the HIGH state of a EEPROM memory cell and a one represents the LOW state. The columns represent the various partial zones, and their value increases from left to right.

| | | |
|---|---|---|
| 000 | 000 | 000 |
| 001 | 000 | 000 |
| 011 | 000 | 000 |
| 111 | 000 | 000 |
| 000 | 001 | 000 |
| 001 | 001 | 000 |
| 011 | 001 | 000 |
| 111 | 001 | 000 |
| 000 | 011 | 000 |
| 000 | 111 | 000 |
| 000 | 000 | 001 |
| 011 | 111 | 111 |
| 111 | 111 | 111 |

The drawing shows an exemplary embodiment of the invention, in which a memory zone SPR, which is intended for storage of the devaluation state of the debit card at a given time, and a logic circuit, which assures that this memory, upon triggering as a counter, cannot be reset.

It is possible to perform the method according to the invention through the use of a monolithically integrable circuit, using an electrically erasable memory with two-transistor memory cells disposed in the form of a matrix. The memory cells have a selection transistor TAZ and a memory transistor TS, which are individually selectable through line selection lines AZ1, ..., AZn and column selection lines AS1, ..., ASm. The control gate terminals of the memory cells are connected line by line to a common control line The drain terminals of the memory cell selection transistors TAZ are connected column by column to column lines. The column lines are each connected through a load element L to a programming potential UP and through switching transistors TAS, which can be triggered through the column selection lines AS1, ..., ASm connected to the gate terminals thereof, to a common first circuit node K1. According to the invention, the control lines of the individual memory cell lines are each connectable through a respective other switching transistor TS1, TS2, ..., TSn to a common second circuit node K2. The gate terminal of each of these other switching transistors TS1, TS2, ..., TSn - 1 is connected to the line selection line of the zone of next-higher value and the gate terminal of the switching transistor of the zone of the highest value is triggerable through a specially secured line FL. The specially secured line FL is in particular equipped with a fusible cutout, for instance a fusible link, and in particular can be activated only by using a security code. The second circuit node K2 is connectable through an erasure switching transistor TLS to an erasing potential UL. The first circuit node K1 is connected to one input of a first AND gate G1 and to the input of an inverting circuit G2. The other input of the first AND gate G1 can be subjected to a conventional evaluation signal EN. The output of the first AND gate G1 is connected to the setting input S of a flip-flop FF. Upon each address change, the reset input R of the flip-flop FF is acted upon by an address change signal ADR or reset signal from the address logic circuit. The output Q of the flip-flop FF is connected to one input of a second AND gate G3 and the other input of the second AND gate G3 is connected to the output of the inverting circuit G2. The output signal of the second AND gate G3 is intended to act upon the control input of the erasure switching transistor TLS. The output of the second AND gate G3 is preferably connected through a level converter circuit PW to the gate terminal of the erasure switching transistor TLS.

If an exemplary embodiment according to the drawing is constructed in such a way that eight memory cells each form one line, each line represents a partial zone of a certain value, and five lines of different values are disposed one above the other, then with these 40 memory cells up to $8^5 = 32768$ units can be recorded.

The flotox memory cells used are written upon when their control gate is at low potential, and because the selection transistor is made conductive, the drain terminal is at programming potential, for instance 20 V. An erasure of the memory cells is effected by the connection of the control gate to erase potential, typically approximately 20 V.

Accordingly, all eight bits of one partial zone of a certain value are always erased simultaneously in the exemplary embodiment.

The logic circuit shown in the drawing assures the security-dictated logical association of writing into a higher-value line zone and erasure of the lower-value addresses by means of the specialized configuration of the EEPROM line control. The line selection signal of the particular line selected enables writing on the memory cells of the selected line, but the switching transistor of this line suppresses the erasure of these memory cells.

For instance, if the selection line AZ1 of the first line is at high potential, then the other switching transistor TS1 is blocked. However, if the selection line AZ2 of the second line is activated, then the other switching transistor TS2, which connects it to the second node K2, is blocked, yet the other switching transistor TS1 of the first line is conductive. As a result, the potential present at the second circuit node K2 is switched through to the control line of the first line. If the erasure switching transistor TLS, which is triggered by the logic circuit, is switched through, then the first line is erased.

The sequence of the logic circuit of this exemplary embodiment will be described as follows:

After establishment of an address, for example in the second line (AZ2=HIGH), a one (1) can be read out at the first node K1, which corresponds to the data line, in the case of a memory cell which is still erased. During an evaluation phase, in which the evaluation signal EN, which serves to act upon one input of the first AND gate, is at high potential, the flip-flop FF is accordingly set. However, as long as the selected memory cell is erased, the second AND gate G3 is still blocked through the inverter circuit G2, so that the erasure switching transistor TLS also blocks and prevents an erasure of the first line. The second AND gate G3 is not released until after the established memory cell has been written upon to "0". An address change between the writing and erasing process would reset the flip-flop FF at the reset input R through the address change signal ADR, so that the erasure process would again be blocked. However, if an already written cell is addressed, the flip-flop FF remains blocked.

This logic circuit accordingly assures a manipulation-proof sequence, because for each free bit of the higher-value EEPROM line, a lower-value line can be erased precisely once, and this erasure is not absolutely compulsory. If a higher-value line is erased, because of the writing of a transfer bit into a still-higher-value line, then the erasure of the lower-value line is again possible for each bit of this now-erased line. The sequence required for recording a transfer bit is assured by this logic circuit.

The highest-value memory line can take place only with another conductive switching transistor TSn of this line. However, this switching transistor TSn is triggered through the line FL equipped with a fusible cutout. Fuses of this type are known as fusible links and are mentioned in Published European Application No. 0 123 177, among other sources. After the activation of the circuit, that is after this fuse burns through, erasure of this memory zone of highest value is not possible, so that an erasure process in the memory is generally prevented, as soon as the memory zone of highest value has been written upon until full The foregoing is a description corresponding in substance to German Application P 37 42 894.2, dated Dec. 17, 1987, the International priority of which is being claimed for the instant application, and which is hereby made part of this application. Any material discrepancies between the foregoing specification and the aforementioned corresponding German application are to be resolved in favor of the latter.

I claim:

1. Method for devaluation of a monolithically integrable electronic circuit of a debit card, including at least one address and control logic circuit and a nonvolatile memory having a zone with memory locations provided for storing updated devaluation status of the debit card, at least part of the memory being electrically erasable and all of the memory locations of the zone of the nonvolatile memory can be read out and written upon bit by bit, which comprises dividing the zone of the nonvolatile memory into partial zones each having a different value in the form of a multi-stage counter, permitting a simultaneous erasure of the memory cells only for all of the memory cells of one partial zone of a given value, and permitting erasure of each partial zone only after a transfer bit has been written into a previously unwritten memory cell of the partial zone of next-higher value, monitoring writing-in with a logic circuit, and permitting an erasure of the partial zone of the highest value only under special conditions.

2. Method according to claim 1, which comprises irreversibly suppressing an erasure of the partial zone of highest value.

3. Method according to claim 1, which comprises irreversibly suppressing an erasure of the partial zone of highest value by destruction of a fusible cutout.

4. Monolithically integrable circuit for devaluation of a monolithically integrable electronic circuit of a debit card having at least one address and control logic circuit and a nonvolatile memory having a zone with memory locations provided for storing updated devaluation status of the debit card, at least part of the memory being electrically erasable and all of the memory locations of the zone of the nonvolatile memory can be read out and written upon bit by bit, the circuit comprising an electrically erasable memory with a matrix of two-transistor memory cells each including a selection transistor, a memory transistor and a control line, line selection lines and column selection lines for individually selecting said memory cells, common control lines connected linewise to the gate terminals of said memory cells, the drain terminals of said selection transistors being connected columnwise to said column selection lines, load elements each connecting a respective one of said column selection lines to a programming potential, a common first circuit node, switching transistors each being connected through a respective one of said column selection lines to said first circuit node, the gate terminals of said switching transistors being connected to and triggered by said column selection lines, a common second circuit node, other switching transistors each connecting a respective control line of said memory cells to said second circuit node, the gate terminal of each of said other switching transistors being connected to said line selection line of the zone of next-higher value, a specially secured line triggering the gate terminal of said other switching transistor of the zone of the highest value, an erasure switching transistor connecting said second circuit node to an erasing potential, and a logic circuit controlling the switching state of said erasure switching transistor.

5. Monolithically integrable circuit according to claim 4, wherein said specially secured line includes a fusible cutout.

6. Monolithically integrable circuit according to claim 4, wherein said specially secured line is activatable only with the use of a security code.

7. Monolithically integrable circuit according to claim 4, including first and second AND gates each having two inputs and an output, an inverting circuit having an input connected to said first circuit node and an output connected to one of said inputs of said second AND gate, said first circuit node also being connected to one of said inputs of said first AND gate, the other of said inputs of said first AND gate being subjected to an evaluation signal, and a flip-flop having a setting input connected to said output of said first AND gate, a reset input acted upon by a reset signal from the address logic circuit upon each address change, and an output connected to the other of said inputs of said second AND gate, and said output of said second AND gate being connected to the control input of said erasure switching transistor.

* * * * *